United States Patent
Norcott et al.

(10) Patent No.: US 6,756,639 B2
(45) Date of Patent: *Jun. 29, 2004

(54) CONTROL OF BURIED OXIDE QUALITY IN LOW DOSE SIMOX

(75) Inventors: Maurice H. Norcott, San Jose, CA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 11 days.

This patent is subject to a terminal disclaimer.

(21) Appl. No.: 10/185,580

(22) Filed: Jun. 28, 2002

(65) Prior Publication Data

US 2003/0008471 A1 Jan. 9, 2003

Related U.S. Application Data

(62) Division of application No. 09/861,593, filed on May 21, 2001, now Pat. No. 6,486,037, which is a continuation-in-part of application No. 09/264,973, filed on Mar. 9, 1999, now Pat. No. 6,259,137, which is a division of application No. 08/995,585, filed on Dec. 22, 1997, now Pat. No. 5,930,643.

(51) Int. Cl.[7] .............................................. H01L 29/00
(52) U.S. Cl. ....................... 257/347; 257/348; 257/349; 257/350; 257/351; 257/352; 257/354; 257/355
(58) Field of Search .............................. 257/347, 348, 257/349–355

(56) References Cited

U.S. PATENT DOCUMENTS

| | | |
|---|---|---|
| 4,749,660 A | 6/1988 | Short et al. |
| 4,786,608 A | 11/1988 | Griffith |
| 4,902,642 A | 2/1990 | Mao et al. |
| 4,975,126 A | 12/1990 | Margail et al. |
| 5,279,978 A | 1/1994 | See et al. |
| 5,288,650 A | 2/1994 | Sandow |
| 5,519,336 A | 5/1996 | Liu et al. |
| 5,589,407 A | 12/1996 | Meyappan et al. |
| 6,043,166 A | 3/2000 | Roitman et al. |
| 6,259,137 B1 * | 7/2001 | Sadana et al. |

FOREIGN PATENT DOCUMENTS

JP 63 217657 9/1988

OTHER PUBLICATIONS

Wolf, S.,"Silicon Processing for the VLSI Era", vol. 2: Process Integration, 1990, pp. 72–73.

White, A.E., et al.,"The role of implant temperature in the formation of thin buried oxide layers", Beam–Solid Interactions and Transient Processes Symposium, Boston, MA, USA, Dec. 1–4, 1986, pp. 585–590, XP000922701.

\* cited by examiner

*Primary Examiner*—Fetsum Abraham
(74) *Attorney, Agent, or Firm*—Scully, Scott, Murphy & Presser; Robert M. Trepp

(57) ABSTRACT

A method of fabricating a defect induced buried oxide (DIBOX) region in a semiconductor substrate utilizing an oxygen ion implantation step to create a stable defect region; a low energy implantation step to create an amorphous layer adjacent to the stable defect region, wherein the low energy implantation steps uses at least one ion other than oxygen; oxidation and, optionally, annealing, is provided. Silicon-on-insulator (SOI) materials comprising a semiconductor substrate having a DIBOX region in patterned or unpatterned forms is also provided herein.

13 Claims, 4 Drawing Sheets

CONTROL OF BURIED OXIDE QUALITY IN LOW DOSE SIMOX

RELATED APPLICATIONS

This application is a divisional application of U.S. application Ser. No. 09/861,593, filed May 21, 2001, now U.S. Pat. No. 6,486,037, issued Nov. 26, 2002, which application is a continuation in part application of U.S. application Ser. No. 09/264,973, filed Mar. 9, 1999, now U.S. Pat. No. 6,259,137, issued Jul. 10, 2001, which is a divisional application of U.S. application Ser. No. 08/995,585, filed Dec. 22, 1997, now U.S. Pat. No. 5,930,643, issued Jul. 27, 1999.

CROSS RELATED APPLICATIONS

This application is related to co-assigned U.S. application Ser. No. 09/861,596, filed May 21, 2001, now U.S. Pat. No. 6,541,356, issued Apr. 1, 2003; co-assigned U.S. application Ser. No. 09/861,594, filed May 21, 2001, now U.S. Pat. No. 6,602,757, issued Aug. 5, 2003; and co-assigned U.S. application Ser. No. 09/861,590, filed May 21, 2001, the entire content of each are incorporated herein by reference.

FIELD OF THE INVENTION

The present invention relates to a method of producing high throughput silicon-on-insulator (SOI) materials and, in particular, to a method of fabricating a defect induced buried oxide (DIBOX) region in a semiconductor substrate. The DIBOX region produced by the method of the present invention has improved structural and electrical qualities as compared with prior art BOX regions. Moreover, the method of the present invention produces BOX regions having a fixed charge and a greater thickness than prior art methods. Hence, the method of the present invention saves implant time and ultimately SOI wafer cost.

BACKGROUND OF THE INVENTION

In semiconductor manufacturing, several processes have been developed to produce a SOI material having a thin buried oxide (BOX) region disposed therein. One such process used in the prior art to produce BOX regions is referred to as SIMOX (separation by implantation of oxygen). In a typical SIMOX process, the BOX region is fabricated by first implanting oxygen using high ion doses (greater than $4 \times 10^{17}$ cm$^{-2}$) followed by annealing at high temperatures (greater than 1300° C.). Despite the current advances made in this field, most of the prior art SIMOX processes produce a BOX region which is electrically inferior to thermally created oxide regions.

Moreover, prior art low-dose SIMOX processes oftentimes create a BOX region which contains silicon islands buried within the BOX. Typically, BOX regions produced using prior art low-dose SIMOX processes have discrete regions of thicknesses of about 1000 Å or 2000 Å. These thicknesses are determined by the implanted oxygen dose which is in the range of about 4–5×10$^{17}$ cm$^{-2}$ for the 1000 Å thick BOX and about 7–10×10$^{17}$ cm$^{-2}$ for the 2000 Å thick BOX. Thinner continuous BOX regions cannot be obtained using prior art SIMOX processes.

Moreover, the prior art uses ion doses to create a BOX region in a semiconductor substrate which makes SIMOX uneconomical and a SIMOX substrate is usually four to six times the bulk-silicon cost. This high cost makes the use of prior art SOI materials undesirable.

In an attempt to reduce the cost of fabricating SOI materials, SIMOX processes using a low dose ion implantation step have been developed. One problem with conventional SIMOX processes using low ion doses is the formation of Si precipitates in the low dose BOX regions. The formation of Si precipitates in the BOX regions is not desirable since it hinders the formation of high quality BOX regions.

Even though BOX quality improves when a room temperature implant follows the base oxygen implant step, Si precipitates are not completely removed. The precipitate density typically increases with increasing base dose. At base doses of greater than $4 \times 10^{17}$ cm$^{-2}$ the room temperature oxygen ion implant step produces BOX regions in which the precipitates are distributed throughout the buried oxide region.

In view of the drawbacks mentioned hereinabove concerning prior SIMOX processes, there remains a need for providing a new and improved method of creating a BOX region within SOI materials. Specifically, it would be desirable to provide a new method wherein low dose ion implants can be used without the resultant BOX region having Si precipitates therein.

SUMMARY OF THE INVENTION

One object of the present invention is to provide a method of fabricating a semiconductor material containing a defect induced buried oxide (DIBOX) region therein.

Another object of the present invention is to provide a method whereby all of the above-mentioned problems with prior art SIMOX processes have been overcome.

A further object of the present invention is to provide a method which allows for the fabrication of a continuous BOX region using ion doses of about $3 \times 10^{17}$ cm$^{-2}$ or less.

A still further object of the present invention is to provide a method which allows for the fabrication of a BOX region that exhibits high structural as well as electrical qualities.

A yet further object of the present invention is to provide a BOX region in a SOI material which has a greater range of thickness than BOX regions prepared using conventional methods.

An even further object of the present invention is to provide a SOI material having a BOX region that contains little or no Si precipitates therein.

An additional object of the present invention is to provide a SOI material having a BOX region in which the charge of the BOX region is fixed to a targeted value.

These as well as other objects and advantages are achieved by the method of the present invention wherein a defect induced buried oxide (DIBOX) region is formed in a semiconductor material by adding to, or replacing oxygen used in the room temperature ion implantation step with another element. The use of other elements in addition to, or besides oxygen in the room temperature ion implant step significantly reduces the Si precipitates in the BOX region.

Specifically, the method of the present invention comprises the steps of:

(a) implanting oxygen ions into a surface of a semiconductor substrate at a base ion dose of about $5 \times 10^{16}$ cm$^{-2}$ or above so as to form a stable buried damaged region in said semiconductor substrate;

(b) implanting second ions into said surface of said semiconductor substrate at a second ion dose of about $1 \times 10^{15}$ cm$^{-2}$ or above so as to form an amorphous layer adjacent to said stable buried damaged region, wherein said second ions comprise at least one dissimilar ion than said oxygen ions used in step (a);

(c) oxidizing the structure produced by step (b); and (d) optionally, annealing the oxidized structure provided in step (c).

According to a preferred embodiment of the present invention, step (a) is carried out by implanting oxygen ions into a Si-containing semiconductor substrate, or a preformed SOI substrate which is either bare or contains a cap layer, e.g., a dielectric cap layer, using a low dose ion implantation step which is carried out at a high temperature of about 200° C. or greater.

Step (b) of the present invention includes a yet lower ion dose implantation step using the same or different energy range as used in step (a). The second ions employed in step (b) include, but are not limited to: nitrogen, carbon, germanium, bismuth, antimony, phosphorus, arsenic, neon, argon, xenon and mixtures thereof. The second ions may also be mixed, in some embodiments, with oxygen.

Step (b) of the present invention is carried out at about cryogenic temperatures to temperatures of about 300° C. or less, with the proviso that the temperature be lower than the oxygen ion implantation step employed in step (a).

This low temperature/low dose ion implantation step, i.e., step (b), may be carried out in either a single step with a single temperature, or multiple steps with multiple temperatures which range from about cryogenic to about 300° C. or less may be employed.

The oxidation step, step (c), is typically carried out in an inert ambient such as $N_2$ or Ar mixed with greater than 0.1% oxygen at temperatures of about 1300° C. or higher.

The optional step of the present invention is an anneal step which is normally carried out in an ambient containing a mixture of an inert gas and <5% oxygen at temperatures of about 1300° C. or higher for a period of time of from about 5 to about 20 hours. The optional anneal step is performed when the foregoing oxidation step does not form a BOX region with desired structural and electrical properties.

The term "high structural quality" is used herein to denote a structure which has little or no etch pit density (less than about $1 \times 10^5$ cm$^2$); little or no top or bottom Si/buried oxide roughness (less than about 200 Å as observed by SEM or TEM); a low HF-defect density (less than about 5 cm$^2$); a low surface roughness (about 6 Å root mean square(Rms)); and, if present, the silicon precipitates in the buried oxide region at a low density (less than about $1 \times 10^5$ cm$^2$) and a small size (less than about 500 Å in height). The structural quality can be determined using optical, atomic force, scanning and/or transmission microscopy.

The term "high electrical quality" is used herein to denote a structure wherein the BOX breakdown field is high (greater than about 5 megavolts per cm); the BOX minibreakdown voltage is high (greater than about 30 volts); the BOX leakage at a given voltage is low (less than about 1 nanoAmps); and the BOX defect density is low (less than about 2 cm$^2$).

Another aspect of the present invention relates to a SOI material having a continuous BOX region formed in a semiconductor substrate by the method of the present invention. The BOX region formed by the instant invention has a variable, but controllable, continuous thickness which can typically range from about 500 to about 2000 Å by varying the oxygen ion implantation step such that the base dose is from about $1 \times 10^{17}$ to about $6 \times 10^{17}$ cm$^{-2}$. Such a controllable, continuous range of BOX thicknesses cannot be obtained utilizing prior art SIMOX processes.

Moreover, the SOI material of the present invention has a BOX region in which the charge thereof is fixed to a targeted value. The fixed charge BOX regions are a result of using different ions during the implantation steps of the present invention.

DETAILED DESCRIPTION OF THE INVENTION

Figure 1A:
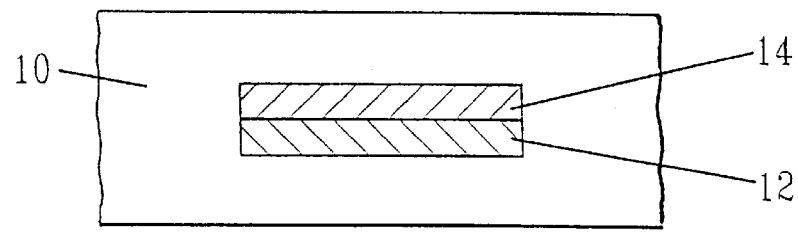
FIGS. 1(a)–(d) are cross-sectional views of a semiconductor substrate after different processing steps of the present invention.
Figure 1B:
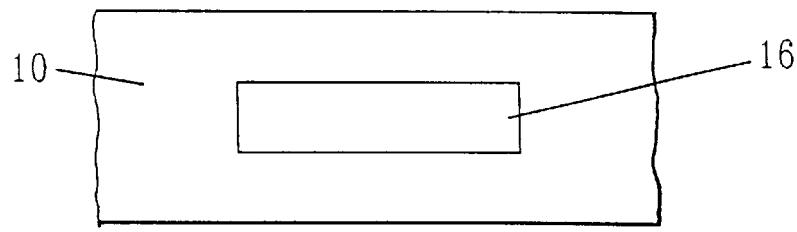
Figure 1C:
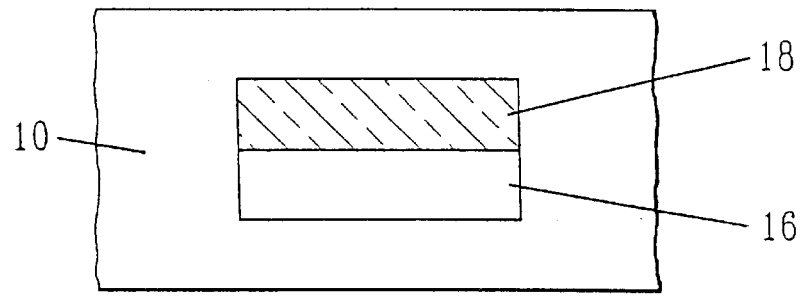
Figure 1D:
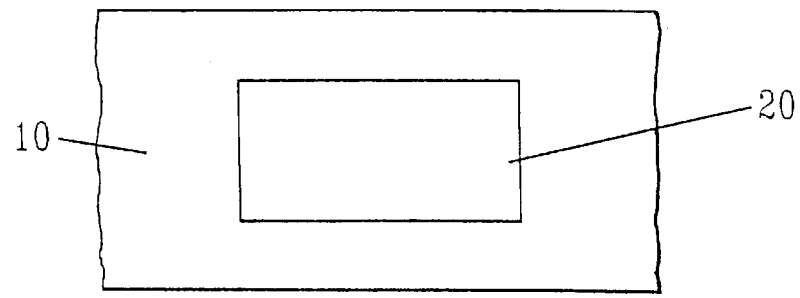

The present invention which provides a method of fabricating a DIBOX in a semiconductor substrate will now be described in more detail with reference to the accompanying drawings wherein like reference numerals are used for describing like and/or corresponding elements of the drawings.

Referring first to FIG. 1(a), there is shown semiconductor substrate 10 containing stable buried damaged region 12 and amorphous region 14 which are formed in the surface of the semiconductor substrate using steps (a) and (b) of the present invention. These two steps as well as other aspects and embodiments of the present invention will now be described. It should be emphasized that the blanket structure shown in FIG. 1(a) can be employed as well as patterned SOI structures which may contain various mask materials such as dielectric cap layers and the like on the surface of the semiconductor substrate to define SOI regions. For clarity, the mask materials or dielectric cap layers that may be present on the surface of semiconductor substrate 10 are not shown in the drawings.

Semiconductor substrate 10 that is employed in the present invention is composed of conventional semiconductor materials which are typically employed in forming SOI devices. Examples of such semiconductor materials include, but are not limited to: silicon (Si), SiC, germanium (Ge), Si/Ge alloys, SiGeC, gallium arsenide (GaAs), and other 4-4, 3-5, 2-6 binary or ternary compounds. A highly preferred semiconductor material for semiconductor substrate 10 is Si or Si/Ge alloys.

Figure 5A:
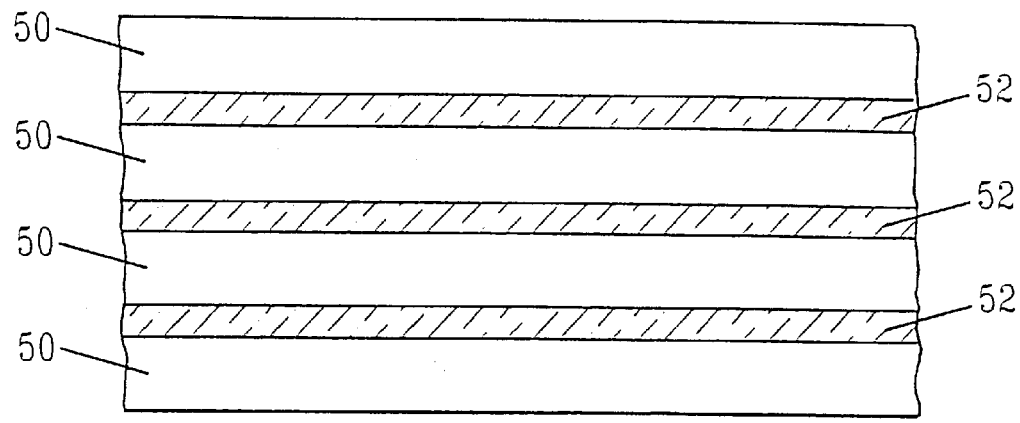
FIGS. 5(a)–5(c) are pictorial representations of some SOI substrates that can be used in the method of the present invention.
Figure 5B:
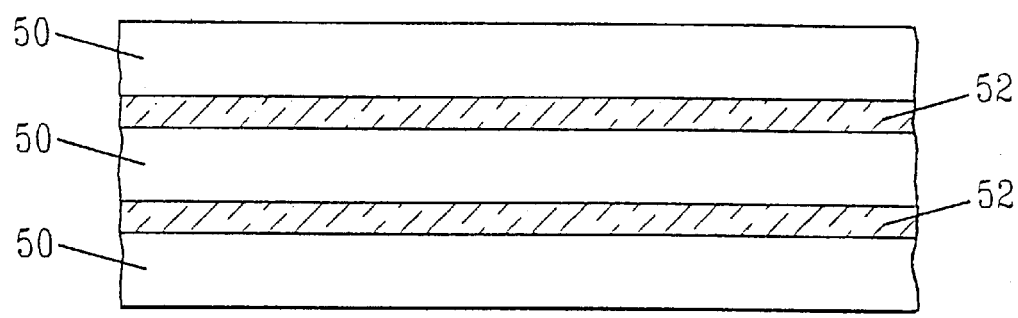
Figure 5C:
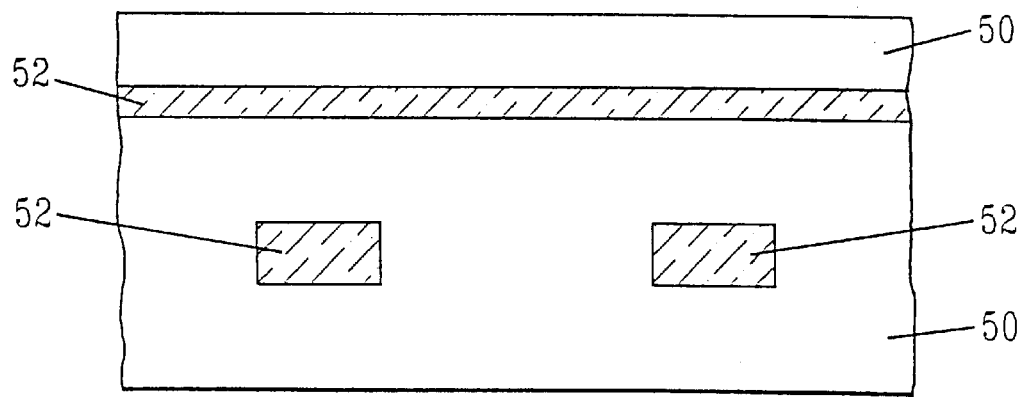

In one embodiment, the starting substrate, i.e., substrate 10, could be an unpatterned or patterned SOI substrate with single or multiple buried oxide layers. Some of these various preformed SOI substrates are shown, for example, in FIGS. 5(a)–5(c). In each of those figures, reference numeral 50 represents the Si-containing layers of the preformed SOI substrate whereas reference numeral 52 represents the buried oxide regions.

The semiconductor substrate can be used as is, or it may be cleaned prior to use to remove any contaminants which may be present in, or on the substrate. Any of the well known cleaning methods known to those skilled in the art may be employed in the present invention to remove said contaminants.

Next, semiconductor substrate 10 is irradiated with oxygen ions at a first dose, i.e., base dose, sufficient to implant said oxygen ions into semiconductor substrate 10. In accordance with this step of the present invention, oxygen ions are implanted into semiconductor substrate 10 by utilizing a SIMOX or other equivalent implanter.

As stated above, oxygen ions are implanted utilizing a high temperature/low dose SIMOX ion implantation step. Accordingly, oxygen ions are implanted utilizing an ion implantation apparatus having a beam current of from about 1 to about 200 milliamps and that operates at an energy of from about 20 to about 400 keV. More preferably, oxygen ions are implanted at an energy of from about 60 to about 210 keV.

The oxygen ion dosage employed in this first implant step is about $5 \times 10^{16}$ cm$^{-2}$ or greater. More preferably, the dosage of the first ion is from about $1 \times 10^{17}$ to about $3.5 \times 10^{17}$ cm$^{-2}$.

This oxygen ion implantation step, or base oxygen ion implantation step, is carried out at a temperature of from about 200° to about 800° C. at a beam current density of from about 0.05 to about 500 mA cm$^{-2}$. More preferably, step (a) of the present invention is carried out at a temperature of from about 200° to about 600° C. at a beam current density of from about 4 to about 20 mA cm$^{-2}$.

Using the above defined parameters, oxygen ions used in forming damaged region 12 are implanted to a depth of from about 1000 to about 10000 Å. It is noted that the depth reported herein for the oxygen ions is the mean range which is based on a Gaussian distribution curve. More preferably, oxygen ions used in forming damaged region 12 are implanted to a depth of from about 2000 to about 4000 Å.

Adjacent amorphous region 14, which is in contact with damaged region 12, is created by irradiating the surface of semiconductor substrate 10 containing damaged region 12 using a low temperature/low dose ion implantation step. The ions used in creating amorphous region 14 in semiconductor substrate 10 include, but are not limited to: nitrogen, carbon, germanium, bismuth, antimony, phosphorus, arsenic, neon, argon, xenon and mixtures thereof. The second ions may also be mixed, in some embodiments, with oxygen. For example, the present invention contemplates the use of both oxygen and nitrogen ions in forming the amorphous region.

Highly preferred second ions used in forming amorphous region 14 are nitrogen, carbon, or germanium, which may or may not be admixed with oxygen. It should be noted that although FIG. 1(*a*) depicts the adjacent amorphous region as being shallower than the damaged region, the present invention also contemplates that amorphous region 14 can be at the same or deeper depth than the damaged region.

The implant energy used in forming amorphous region 14 is from about 50 to about 210 keV. More preferably, amorphous region 14 is formed by implanting the second ions using an energy of from about 100 to about 210 keV. The beam current density employed in this step of the present invention is from about 0.05 to about 5 mA cm$^{-2}$. Note that the same or different energy range as used in step (a) may be employed here for step (b). The dose of the second ions used in forming amorphous region 14 is about $1 \times 10^{15}$ cm$^{-2}$ or above, with a dose of from about $1 \times 10^{15}$ to about $4 \times 10^{15}$ cm$^{-2}$ being more preferred.

Unlike the first step of the present invention, which is conducted at high temperatures, the second implant is conducted at much lower temperatures (less than about 300° C.). This lower ion implantation is sometimes referred to herein as a 'room temperature' ion implantation step. Specifically, amorphous region 14 is formed by implanting second ions at a temperature of from about −269° to about 300° C. for a time period of from about 5 seconds to about 20 minutes. More preferably, the low temperature/low dose ion implantation step is carried out at a temperature of from about 25° to about 150° C. for a time period of from about 30 seconds to about 5 minutes.

Using the above defined conditions, second ions used in forming amorphous region 14 are implanted to a projected depth of from about 1000 to about 6000 Å. More preferably, second ions used in forming amorphous region 14 are implanted to a depth of from about 3000 to about 4500 Å.

After creating damaged region 12 and amorphous region 14 in semiconductor substrate 10, the semiconductor material is then subjected to oxidation under conditions effective to cause diffusion of oxygen into semiconductor substrate 10. Under appropriate conditions, a continuous BOX region 16 is formed, as is shown in FIG. 1(*b*). Note that the presence of the second ions controls the growth of oxide within the substrate so that it is possible to fabricate a SOI material having a thin BOX region (on the order of about 2000 Å or less).

An intermediate structure which comprises a thin layer of highly defective silicon 18 adjacent to and connected to BOX region 16 can also be created by modifying oxidation conditions, as shown in FIG. 1(*c*). Such structures are highly desirable in SOI based integrated circuits where floating body effects need to be minimized. Further steps, i.e., annealing, are typically required when this intermediate structure forms.

In accordance with the present invention, oxidation is carried out in an inert ambient that is mixed with oxygen. Typically, the inert ambient comprises an atmosphere of nitrogen, argon, helium or mixtures thereof that is mixed with about 0.1 to about 100% oxygen. A highly preferred ambient utilized in the present invention during the oxidation step is argon (Ar) that is mixed with about 10 to about 70% oxygen.

The oxidation step is carried out at a temperature of from about 1300° to about 1375° C. for a time period of from about 1 to about 50 hours. More preferably, the oxidation step of the present invention is carried out at a temperature of from about 1320° to about 1350° C. for a time period of from about 5 to about 15 hours. The annealing cycle may consist of either a single or multiple oxidation steps with varying amounts of oxygen, and these steps may follow an anneal step. Following oxidation, the surface oxide that is formed may or may not be removed with HF prior to annealing.

Intermediate structures can be formed either by partial annealing with oxygen concentrations of greater than 5% with anneal times of less than 10 hours at a temperature of about 1320° C. or less, or by reducing the oxygen concentration in the anneal ambient with prolonged anneal times of greater than 10 hours at a temperature of about 1350° C. or less.

When the intermediate structure shown in FIG. 1(*c*) is formed, it is then annealed in an inert gas atmosphere, e.g., nitrogen, argon and the like, under conditions which are effective in improving the previously-formed buried oxide regions. The annealing step may also be carried out in an inert gas atmosphere that is mixed with from about 0.1 to about 70% oxygen. FIG. 1(*d*) shows the after annealed product containing a new buried oxide region 20. Buried oxide region 20 is formed by annealing at a temperature of from about 1250° to about 1400° C. for a time period of from about 1 to about 24 hours. More preferably, annealing is conducted at a temperature of from about 1320° to about 1350° C. for a time period of from about 5 to about 15 hours.

In addition to separate oxidation and annealing steps, the present invention also contemplates combining these two processes into one heat cycle. When this embodiment of the present invention is carried out, the structure containing damage region 12 and amorphous region 14 is subjected to the following conditions: First, the structure is initially heated from room temperature to a temperature of from about 1300° to about 1400° C. using a ramp-up rate of from about 0.1° to about 10° C./min. This initial heating is typically carried out in an inert gas atmosphere which can be mixed with oxygen. When oxygen is present in the initial heating step, it typically is present in an amount of from 0.1 to about 100%.

Various hold or so-called 'soak cycles' may be included in the initial heating step. When such a soak cycle is required, it typically occurs at about 1000° C. for a time period of from about 5 to about 120 minutes. After the soak cycle, the structure is heated from 1000° C. to the desired oxidation temperature (from about 1300° to about 1375° C.) at a ramp-up rate of from about 0.1 to about 5° C./min.

Thereafter, oxidation alone or oxidation and annealing as described hereinabove are carried out followed by subsequent cooling to room temperature in an inert gas atmosphere which may contain from about 0.1 to about 100% oxygen at a cool-down rate of from about 0.1° to about 5° C./min. Various hold or soak cycles may be employed in the cool-down portion of the heating cycle. Also, it is contemplated to change the rate of cooling during the cooling cycle. For example, at a temperature of from about 900° to about 1100° C., the cooling rate may be changed to about 0.1° to about 10° C./min until a temperature reading of from about 600° to about 800° C. is obtained. Thereafter, the cooling rate may be switched to another rate within the range of from about 3° to about 10° C./min.

It is noted that during the above described annealing step, which is carried out under a high oxygen content, two adjacent stable buried regions are created. Specifically, a highly defective region consisting of primarily Si polycrystals, microtwins and stacking faults form in the amorphous region. This defect-containing layer is believed to enhance oxygen diffusion into silicon and combines with the first created damaged layer during this annealing step to form the buried oxide region in the semiconductor substrate.

The above description provides an illustration of the basic processing steps of the present invention. The following description provides some alternative processing steps that may be used with the method of the present invention.

In some instances, a Si-containing layer is formed on the surface of the substrate prior to conducting the oxidation step. In such an embodiment, the added Si-containing layer is formed utilizing conventional deposition processes well known in the art such as chemical vapor deposition (CVD), plasma-assisted CVD, evaporation, sputtering, chemical solution deposition and other like deposition processes. Alternatively, the Si-containing layer may be formed by an epitixial growth process.

The Si-containing layer, which may comprise amorphous Si, polycrystalline Si (i.e., polySi), epitaxial Si (epi-Si), SiGe, SiC or combinations and multilayers thereof, has a thickness of from about 100 to about 10000 Å, with a thickness of from about 500 to about 3500 Å being more highly preferred.

In another embodiment of the present invention, discrete and isolated BOX regions can be formed in the substrate by forming a patterned mask on the surface of the substrate prior to ion implantation. When such an embodiment is employed, a dielectric material or other appropriate masking layer is applied to the surface of the substrate. Next, conventional lithography and etching are employed in forming a patterned mask which includes at least one opening therein that exposes the surface of the substrate. The method of the present invention is then performed and thereafter the patterned mask is stripped from the substrate.

In one embodiment, the patterned dielectric mask is removed prior to oxidation alone or oxidation and annealing and a Si-containing layer, as described above, is formed on the substrate which contains the buried damaged and amorphous regions.

In yet another embodiment, the patterned mask is not removed after the room temperature ion implant step and a Si-containing layer, as described above, is formed in the at least one opening. Oxidation and annealing is then performed and following both processes the patterned mask is removed. This forms discrete and isolated BOX regions within the substrate in which the top layer of the SOI material extends above the surface of the patterned substrate.

The structures formed in the present invention can be used in forming high-performance SOI devices or circuits. Examples of such devices or circuits that can contain the DIBOX of the present invention include microprocessors, memory cells such as DRAMs or SRAMs, ASICs (advanced semiconductor integrated circuits) and larger and more complicated circuits. Since these devices are well known to those skilled in the art, it is not necessary to provide a detailed description on how the same is fabricated.

The BOX regions 16 or 20, i.e., DIBOX regions, formed by the method of the present invention generally have a mean thickness of from about 500 to about 2000 Å. More preferably, the BOX thickness produced by the instant invention is from about 1000 to about 1500 Å. It is possible to create any number of patterned or unpatterned BOX regions at various depths within a semiconductor or preformed SOI material having various thicknesses by simply making the first DIBOX region followed by an epitaxial deposition of silicon-containing material and then repeating the steps of the present invention. The resulting structures in such circumstances would be similar to the ones depicted in FIGS. 5(a)–5(c).

It is noted that, if the amorphous region is not formed by the second implant, the BOX region is not continuous for ion doses of $3 \times 10^{17}$ cm$^{-2}$ or less. Moreover, pronounced surface roughness (>15 Å Rms) is observed on such samples by atomic force microscopy. Such surface roughness is incompatible with modern high density integrated circuits. In contrast, by employing the implant and annealing sequence listed above, i.e., base dose implantation and room temperature implantation in conjunction with oxidation alone or oxidation and annealing, a highly continuous BOX structure is formed without causing any depreciable surface roughness which would limit the applicability of the sample. In the case where oxygen is implanted in steps (a) and (b), a continuous BOX region is formed directly after the oxidation step.

Figure 2:
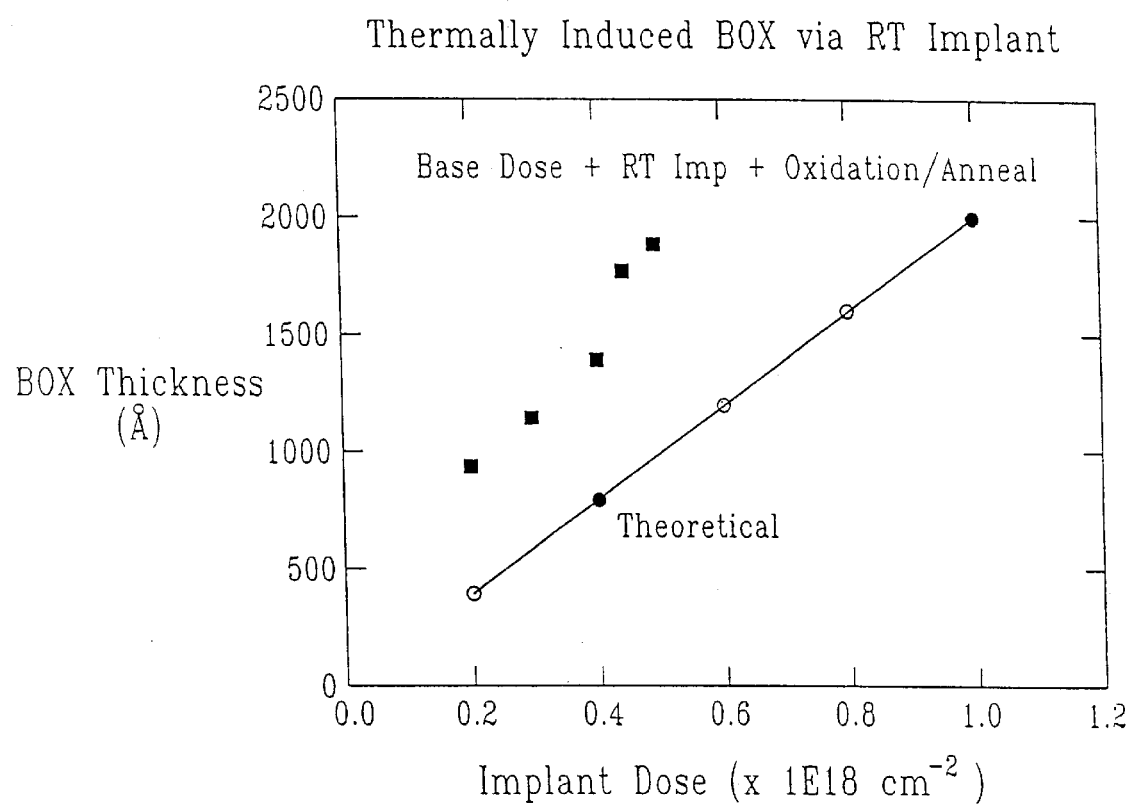
FIG. 2 is a plot showing how the damage created by room temperature implantation enhances diffusion of oxygen in a silicon-containing substrate during high temperature annealing and creates additional oxide in the ion implanted region.

Also, as is shown in FIG. 2, the method of the present invention, i.e., room temperature implantation and high temperature annealing, enhances the diffusion of oxygen into the silicon. Specifically, in FIG. 2 the circles show how much buried oxide can be formed theoretically based on the ion dose. The squares in FIG. 2 show how much actual buried oxide is created by one embodiment of the method of the present invention. The difference of thickness at a given base dose gives the extra thermal buried oxide region created by the present invention. Thus, the method of the present invention, not only improves the electrical and structural qualities of the BOX, but also saves implant time and SOI wafer cost.

Figure 3:
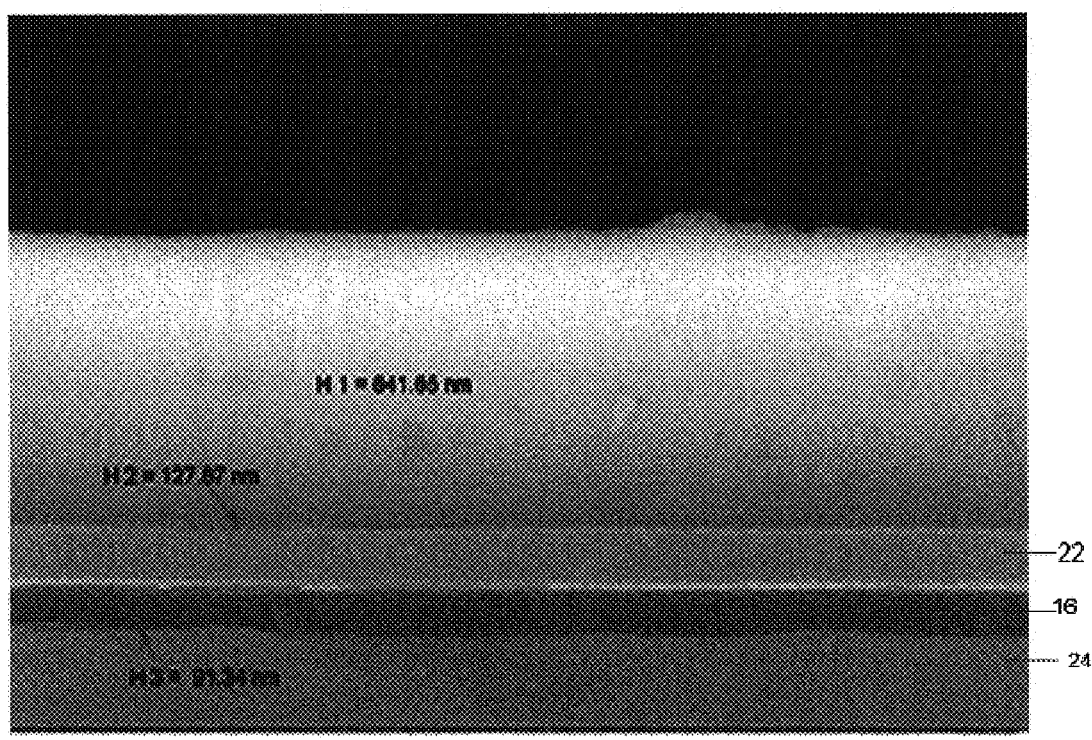
FIG. 3 is a SOI material of the present invention shown via a SEM (scanning electron microscopy).
Figure 4:
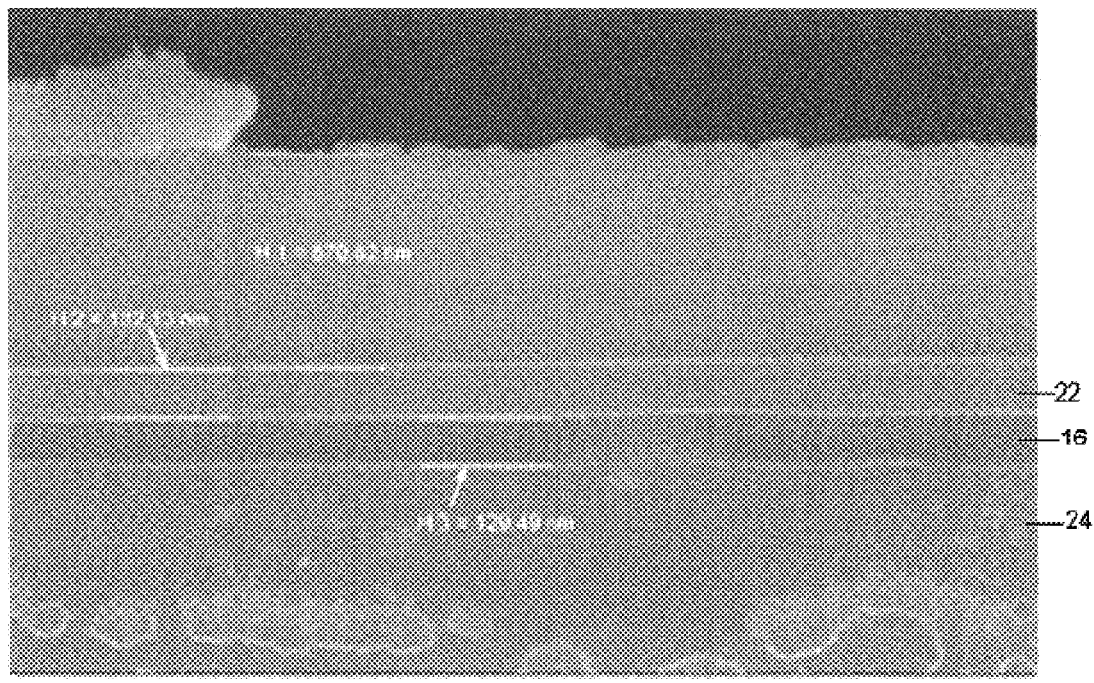
FIG. 4 is another SOI material of the present invention shown via a SEM (scanning electron microscopy).

Typical SOI materials that are formed in the present invention are shown, for example, in the SEMs of FIGS. 3 and 4. In these SEMs, a continuous BOX region 16 electrically isolates superficial Si-containing layer 22 from bottom Si-containing layer 24.

The following example is given to illustrate the scope of the present invention. Because this example is given for illustrative purpose only, the invention embodied thereon should not be limited thereto.

EXAMPLE

In this example, various DIBOX regions were created using the method of the present invention. Specifically, DIBOX regions were created in three Si wafers using the following conditions and procedures:

For Wafer 1:
- (a) base implant ion $O^+$; implant energy 210 keV; implant dose $3 \times 10^{17}$ cm$^{-2}$; implant temperature <300° C., beam current 55 mA;
- (b1) room temperature implant ion $O^+$; implant energy 210 keV; implant dose $1 \times 10^{15}$ cm$^{-2}$; implant temperature room temperature; beam current 1 mA;
- (b2) room temperature implant ion $N^+$; implant energy 190 keV; implant dose $1 \times 10^{15}$ cm$^{-2}$; implant temperature room temperature; beam current 1 mA;
- (c) oxidation: ramp-up from 200° C. to 1000° C., 5° C./min, ambient Ar and 5% $O_2$; Soak at 1000° C., 30 min, ambient 100% $O_2$; ramp-up from 1000° to 1320° C.: 0.5° C./min, ambient 60% Ar and 40% $O_2$; hold 5 hours;
- (d) anneal continue from (c): temperature 1320° C., ramp-rate 0.5° C./min, hold 5 hrs, ambient Ar and 4% $O_2$; ramp-down to 1000° C. at 0.5° C./min; ramp-down from 1000° C. to 800° C. at 3° C./min; ramp-down from 800° C. to 200° C. at 4.5° C./min.

For Wafer 2:
- (a) base implant ion $O^+$; implant energy 120 keV; implant dose $2 \times 10^{17}$ cm$^{-2}$; implant temperature 550° C.; beam current 50 mA;
- (b) room temperature implant ion $N^+$; implant energy 110 keV; implant dose $1 \times 10^{15}$ cm$^{-2}$, implant temperature room temperature; beam current 1 mA;
- (c) oxidation: ramp-up from 200° C. to 1000° C., 5° C./min, ambient Ar and 5% $O_2$; soak at 1000° C., 30 min, ambient 100% $O_2$; ramp-up from 1000° C. to 1320° C., 0.5° C./min, ambient 90% Ar and 10% $O_2$; hold 15 hrs;
- (d) ramp-down to 1150° C. at 0.5° C./min; ramp-down from 1150° C. to 800° C. at 5° C./min; ramp-down from 800° C. to 200° C. at 4.5° C./min.

For Wafer 3
- (a) base implant ion $O^+$; implant energy 210 keV; implant dose $2.5 \times 10^{17}$ cm$^{-2}$; implant temperature 550° C.; beam current 55 mA;
- (b1) room temperature implant ion $O^+$; implant energy 210 keV; implant dose $1 \times 10^{15}$ cm$^{-2}$, temperature room temperature; beam current 1 mA;
- (b2) room temperature implant ion $N^+$; implant energy 190 keV; implant dose $1 \times 10^{15}$ cm$^{-2}$; implant temperature room temperature; beam current 1 mA;
- (c) oxidation: ramp-up from 200° C. to 1000° C., 5° C./min, ambient Ar and 5% $O_2$; soak at 1000° C., 30 min., ambient 100% $O_2$; ramp-up from 1000° C., 30 min., ambient 100%; ramp-up from 1000° C. to 1200° C., 3.0° C./min, ambient 100% $O_2$; hold 3 hrs. Oxidation continues with 60% Ar and 40% $O_2$ from 1200° C. to 1325° C. at a ramp rate of 0.5° C./min, hold for 15 hours at 1325° C.
- (d) ramp-down to 1100° C. at 0.5° C./min; ramp-down with 60% Ar and 40% O2 from 1100° C. to 800° C. at 3° C./min; ramp-down from 800° C. to 200°C. 4.5° C./min.

After conducting the above steps, the properties referred to in the following table were determined using standard procedures well known in the art.

Table of Physical Data for SOI materials created above:

| | WAFER 1 | WAFER 2 | WAFER 3 |
|---|---|---|---|
| BOX THICKNESS, Å. | 980 | 1038 | 893 |
| SOI THICKNESS, Å. | 1200 | 200 | 350 |
| Breakdown VOLTAGE, µV/cm. | 60 | 60 | 75 |
| ELECTRICAL DEFECT DENSITY, cm$^{-2}$ | 1 | 1 | 0.5 |

While the instant invention has been particularly shown and described with respect to preferred embodiments thereof, it will be apparent to those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having this described our invention, what we claim is new, and desire to secure by the Letters Patent is:

1. A silicon-on-insulator (SOI) material comprising a buried oxide (BOX) region that electrically isolates a superficial Si-containing layer from a bottom Si-containing layer, wherein said BOX region has a fixed charge, a controllable thickness and little or no Si precipitates.

2. The SOI material of claim 1 wherein said BOX region is a continuous BOX region.

3. The SOI material of claim 1 wherein said BOX region is a discrete and isolated region.

4. The SOI material of claim 1, wherein said BOX region has a breakdown voltage of greater than about 5 megavolts per cm.

5. The SOI material of claim 1 wherein said BOX region has a minibreakdown voltage of greater than about 30 volts.

6. The SOI material of claim 1 wherein said BOX region has a leakage at a given voltage of less than about 1 nanoAmps.

7. The SOI material of claim 1 wherein the BOX region has a defect density of less than about 2 cm$^2$.

8. The SOI material of claim 1 wherein the controllable thickness range is from about 500 to about 2000 Å.

9. The SOI material of claim 1 wherein said precipitates have a density of less than about $1 \times 10^5$ cm$^2$.

10. The SOI material of claim 1 wherein said precipitates have a size of less than about 500 Å.

11. The SOI material of claim 1 wherein said material has an etch pit density of less than about $1 \times 10^5$ cm$^2$.

12. The SOI material of claim 1 wherein said superfacial Si-containing layer and said BOX region have an interface which has an observable oxide roughness of less than about 200 Å.

13. The SOI material of claim 1 wherein said material has a HF-defect density of less than 5 cm$^2$.

* * * * *